US009355701B2

(12) United States Patent
Oh et al.

(10) Patent No.: US 9,355,701 B2
(45) Date of Patent: May 31, 2016

(54) NONVOLATILE MEMORY DEVICE AND DATA WRITE METHOD

(71) Applicants: Eun Chu Oh, Hwaseong-Si (KR); Junjin Kong, Yongin-Si (KR); Younggeon Yoo, Seoul (KR); Kijun Lee, Seoul (KR)

(72) Inventors: Eun Chu Oh, Hwaseong-Si (KR); Junjin Kong, Yongin-Si (KR); Younggeon Yoo, Seoul (KR); Kijun Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 114 days.

(21) Appl. No.: 14/179,614

(22) Filed: Feb. 13, 2014

(65) Prior Publication Data
US 2014/0281824 A1 Sep. 18, 2014

(30) Foreign Application Priority Data

Mar. 15, 2013 (KR) .................. 10-2013-0028050

(51) Int. Cl.
*G11C 11/16* (2006.01)
*G11C 11/22* (2006.01)
*G11C 13/00* (2006.01)
*G11C 29/04* (2006.01)
*G11C 7/10* (2006.01)

(52) U.S. Cl.
CPC .......... *G11C 11/1675* (2013.01); *G11C 7/1006* (2013.01); *G11C 11/2275* (2013.01); *G11C 13/0004* (2013.01); *G11C 13/0007* (2013.01); *G11C 13/0069* (2013.01); *G11C 2013/0076* (2013.01); *G11C 2029/0411* (2013.01)

(58) Field of Classification Search
CPC ............ G06F 11/1666; G11C 13/0069; G11C 7/1006; G11C 13/0007; G11C 13/0004; G11C 11/2275; G11C 11/1675; G11C 2013/0076; G11C 2029/0411
USPC ........................................................ 714/773
See application file for complete search history.

(56) References Cited

U.S. PATENT DOCUMENTS

| 6,862,235 | B2 | 3/2005 | Sakata et al. |
| 7,177,062 | B2 * | 2/2007 | Yano .................... G09G 3/3648 359/238 |
| 7,325,157 | B2 | 1/2008 | Sesek et al. |
| 8,250,417 | B2 * | 8/2012 | Feeley ................ G06F 11/1068 714/718 |
| 8,429,498 | B1 * | 4/2013 | Anholt ................... G11C 29/00 365/227 |

(Continued)

FOREIGN PATENT DOCUMENTS

| JP | H10-333991 A | 12/1998 |
| JP | 2006-526833 A | 11/2006 |

(Continued)

*Primary Examiner* — James C Kerveros
(74) *Attorney, Agent, or Firm* — Volentine & Whitt, PLLC

(57) ABSTRACT

A data write method of a nonvolatile memory device is provided which includes receiving write data to be stored in selected memory cells; reading data stored in the selected memory cells; processing the write data according to a plurality of data modulation manners to generate a plurality of modulated data values; calculating the number of flip bits and the number of switching bits when the write data and the plurality of modulated data values are overwritten on the selected memory cells, each flip bit indicating that a logical value of a selected memory cell is reversed and each switching bit indicating that a logical value of a selected memory cell is switched from a first logical value to a second logical value; and selecting one of the write data and the plurality of modulated data values according to calculating the number of flip bits and the number of switching bits.

10 Claims, 14 Drawing Sheets

(56) References Cited

U.S. PATENT DOCUMENTS

| | | | |
|---|---|---|---|
| 8,719,659 B2 * | 5/2014 | Iwatsuki | G11C 29/56 714/763 |
| 2003/0051206 A1 * | 3/2003 | Kondo | H03M 13/09 714/795 |
| 2006/0155882 A1 | 7/2006 | Jochemsen et al. | |
| 2008/0178061 A1 * | 7/2008 | Mead | G06F 11/1044 714/766 |
| 2009/0172496 A1 * | 7/2009 | Roine | G06F 11/1008 714/758 |
| 2009/0285023 A1 | 11/2009 | Cho et al. | |
| 2009/0319859 A1 | 12/2009 | Alrod et al. | |
| 2010/0241927 A1 | 9/2010 | Soma | |
| 2011/0032759 A1 | 2/2011 | Kim et al. | |
| 2011/0185251 A1 * | 7/2011 | d'Abreu | G06F 11/1072 714/752 |
| 2011/0216586 A1 * | 9/2011 | Graef | G11C 7/02 365/185.02 |
| 2011/0239090 A1 * | 9/2011 | Iwatsuki | G11C 29/56008 714/763 |
| 2012/0127804 A1 | 5/2012 | Ong et al. | |
| 2013/0073785 A1 * | 3/2013 | Emma | G06F 12/0223 711/103 |

FOREIGN PATENT DOCUMENTS

| | | |
|---|---|---|
| JP | 2009-301264 A | 12/2009 |
| JP | 2010-140132 A | 6/2010 |
| JP | 2010-218447 A | 9/2010 |
| JP | 2011-521393 | 7/2011 |
| KR | 10-2011-0015269 A | 2/2011 |
| KR | 10-2011-0036816 A | 4/2011 |
| KR | 10-2012-0053953 A | 5/2012 |

* cited by examiner

US 9,355,701 B2

NONVOLATILE MEMORY DEVICE AND DATA WRITE METHOD

CROSS-REFERENCE TO RELATED APPLICATIONS

A claim for priority under 35 U.S.C. §119 is made to Korean Patent Application No. 10-2013-0028050 filed Mar. 15, 2013, the subject matter of which is hereby incorporated by reference.

BACKGROUND

The inventive concept relates generally to semiconductor memory devices. More particularly, embodiments of the inventive concept relate to nonvolatile memory devices incorporating memory cells programmed in accordance with a constituent magnetization layer. Other embodiments of the inventive concept relate to write methods capable of programming such nonvolatile memory devices.

The demand for nonvolatile, random access memory (RAM) devices having dense memory cell integration and acceptable data access speeds has increased over the past years. Flash memory devices have historically met much of the demand for nonvolatile memory in handheld electronic devices. However, research and development directed to other types of nonvolatile memory have continued in the ongoing quest for improved memory system performance. For example, contemporary research and development has been directed to the ferroelectric RAM (FRAM) that uses a ferroelectric capacitor, the magnetic RAM (MRAM) that uses a tunneling magneto-resistive (TRM) film, the phase-change RAM (PRAM) that uses one or more chalcogenide alloys, and the resistive RAM (RRAM) that uses a variable resistance material. Each of these "alternate nonvolatile memory types" has been proposed as a possible replacement for flash memory.

Of important note, a memory cell in each of these alternate nonvolatile memory types is capable of being directly "overwritten" with data without the need to first erase previously stored data as is the case with flash memory. However, such alternate nonvolatile memory devices require different respective "biases" according to the logical values to be written in constituent memory cells. For example, the current or voltage level required to write a logical '1' value in a memory cell may be different than the current or voltage level required to write a logical '0' value. Additionally, the write speed(s) and/or data integrity associated with different logical values vary according to alternate nonvolatile memory type.

Generally speaking and regardless of nonvolatile memory type being considered, any performance and/or operational difference related to respective data values to be written to a nonvolatile memory cell may be termed a "write-asymmetry" characteristic. Such characteristics must be carefully considered in the design and operation of any alternate nonvolatile memory system.

SUMMARY

In one embodiment, the inventive concept is directed to a data write method for a nonvolatile memory device, the method comprising; receiving externally provided write data to be stored in selected memory cells during a write operation, reading previous data previously stored in the selected memory cells, modulating the write data to generate modulated write data, counting a first number of flip bits and a first number of switching bits that result when the previous data is overwritten by the write data, and counting a second number of flip bits and a second number of switching bits that result when the previous data is overwritten by the modulated write data, selecting one of the write data and the modulated write data to be selected data based on the first number of flip bits, the first number of switching bits, the second number of flip bits, and the second number of switching bits, and writing the selected data to the selected memory cells.

In another embodiment, the inventive concept is directed to a data write method for a nonvolatile memory device, the method comprising; receiving externally provided write data to be stored in selected memory cells during a write operation, reading previous data previously stored in the selected memory cells, modulating the write data using different modulation schemes to generate corresponding sets of modulated write data, counting respective numbers of flip bits and respective numbers of switching bits that result when the previous data is overwritten by the write data, and by each one of the sets of modulated write data, selecting the write data or one of the sets of modulated write data as selected data based on the respective numbers of flip bits and the respective numbers of switching bits, and writing the selected data to the selected memory cells.

In still another embodiment, the inventive concept is directed to a data write method for a nonvolatile memory device, the method comprising; receiving write data to be written to selected memory cells, reading previous data previously stored in the selected memory cells, counting a number of switching bits that result when the write data is used to overwrite the previous data, comparing the number of switching bits to a first reference to generate a first comparison result, selecting between a first ECC mode and a second ECC mode based on the first comparison result, using the selected one of the first ECC mode and the second ECC mode to encode the write data to generate encoded write data, and writing the encoded write data to the selected memory cells.

BRIEF DESCRIPTION OF THE DRAWINGS

Certain embodiments of the inventive concept are illustrated in relevant portion in the accompanying drawings, wherein.

DETAILED DESCRIPTION

Figure 1:
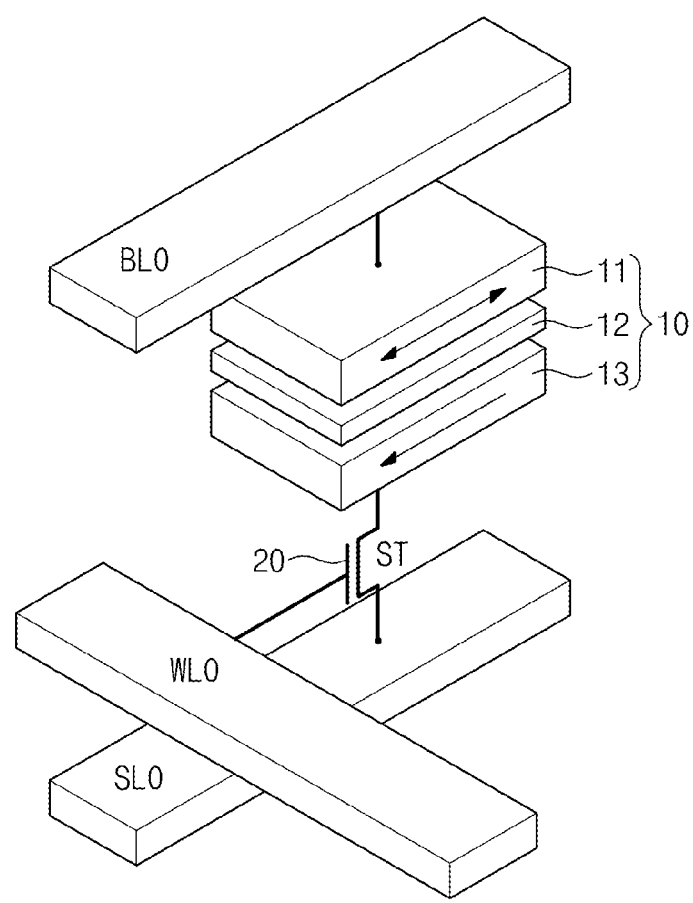
FIG. 1 is a perspective diagram of a magnetic memory cell that may be used in a nonvolatile memory device.

Embodiments of the inventive concept will now be described in some additional detail with reference to the accompanying drawings. The inventive concept may, however, be embodied in various different forms and should not be construed as being limited to only the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals and labels denote like or similar elements throughout. In the drawings, the size(s) and relative size(s) of various material layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The written description that follows and the accompanying drawings are primarily directed to particular embodiments of the inventive concept incorporating magnetic memory cells. That is, for descriptive purposes teaching the making and use of a broad range of alternate nonvolatile random access memory types, the subject specification describes in detail certain magnetic random access memory (MRAM) devices. Those skilled in the art will understand that the inventive concept is not limited to only MRAM devices. Rather, various embodiments of the inventive concept may be implemented using different alternate nonvolatile memory devices.

FIG. 1 is a perspective diagram illustrating a magnetic memory cell that may be used in the MRAM device. As will be appreciated by those skilled in the art, the MRAM stores data in accordance with the magnetic polarization state of a thin film of a magnetic material. A write operation performed by the MRAM involves changing (or not) the magnetic polarization state of the thin film in accordance with a given data value to be stored and in accordance with an applied magnetic field that is generated by a bit line current or a word line current. Referring to FIG. 1, a memory cell generally includes a variable resistance portion 10 and a selection transistor 20.

The variable resistance portion 10 includes a free magnetic layer 11, a tunnel junction layer 12, and a fixed magnetic layer 13. The thickness of the fixed magnetic layer 13 is relatively greater than that of the free magnetic layer 11. The polarization state of the fixed magnetic layer 13 is changed only when a relatively strong magnetic field is applied. On the other hand, the polarization state of the free magnetic layer 11 is changed when a relatively weak magnetic field is applied.

The tunnel junction layer 12 is usually formed between the fixed magnetic layer 13 and free magnetic layer 11, and serves to separate the fixed magnetic layer 13 and free magnetic layer 11. Each of the fixed magnetic layer 13 and free magnetic layer 11 may be formed of a magnetically responsive material such as NiFeCo, CoFe, etc. The tunnel junction layer 12 may be formed of a material such as MgO, AlO3, etc.

An electrical resistance value of the variable resistance portion 10 formed by the stacked combination of the free magnetic layer 11, tunnel junction layer 12, and fixed magnetic layer 13 is varied in accordance with the magnetization directions of the free magnetic layer 11 and fixed magnetic layer 13. When the magnetization directions of the free magnetic layer 11 and fixed magnetic layer 13 are the same (i.e., in a "parallel state"), the variable resistance portion 10 will have a relatively low resistance value. On the other hand, when the magnetization directions of the free magnetic layer 11 and fixed magnetic layer 13 are not the same (i.e., opposite to each other or in an "anti-parallel state"), the variable resistance portion 10 will have a relatively large resistance value.

The selection transistor 20 may be turned ON/OFF according to a word line voltage level. During a data access operation, the variable resistance portion 10 may be activated or inactivated according to whether the selection transistor 20 is turned ON/OFF. For example, when the selection transistor 20 is turned ON, a write current flows to the variable resistance portion 10. A resistance state of the variable resistance portion 10 may be variable according to a direction and a level of the write current (or a write voltage) applied to the variable resistance portion 10. On the other hand, when the selection transistor 20 is turned OFF, no write current flows to the variable resistance portion 10.

Figure 2:
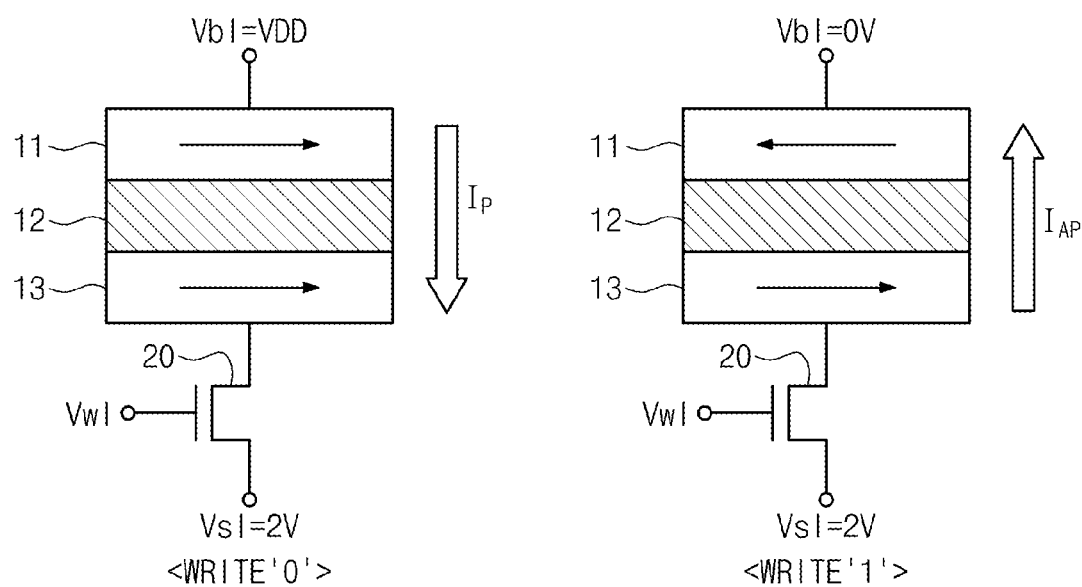
FIG. 2 is a cross-sectional diagram illustrating one method of writing data to the memory cell of FIG. 1.

FIG. 2 is a cross-sectional diagram illustrating a method of writing data in the memory cell of FIG. 1. The method illustrated in FIG. 2 assumes a writing of a logical '1' value or a logical '0' value using the variable resistance portion 10.

During a write operation, the variable resistance portion 10 may be magnetized to have a parallel state P or an anti-parallel state AP. The parallel state P is assumed to correspond to a logical '0' value, and the anti-parallel state AP is assumed to correspond to a logical '1' value.

Referring to a write operation for the logical '0' value, a forward write current $I_P$ may flow to the variable resistance portion 10 in a direction from a drain to a source. At this time, a word line voltage Vwl may be applied such that a selection transistor 20 is turned on. If a bit line voltage Vbl and a source voltage Vsl are applied to write a logical '0' value in the variable resistance portion 10, magnetization directions of free and fixed magnetic layers 11 and 13 may be set to the same direction. This magnetization state may correspond to a parallel state P of the variable resistance portion 10. Also, this magnetization state may mean that a logical '0' value is written in the variable resistance portion 10. The variable resistance portion 10 having the parallel state P may have a relatively small resistance value.

Referring now to the write operation for the logical '1' value, the variable resistance portion 10 is biased such that a backward write current $I_{AP}$ flows in a direction from a source to a drain. That is, a magnetization direction of the free magnetic layer 11 may be set to be opposite to a magnetization direction of the fixed magnetic layer 13 by a bit line voltage Vbl and a source voltage Vsl. The anti-parallel state may mean that a logical '1' value is written in the variable resistance portion 10. The variable resistance portion 10 having the anti-parallel state P may have a relatively large resistance value.

There is exemplarily described a data write method of the MRAM. As above described, a bias condition when a logical '1' value is written in an MRAM cell may be different from that when a logical '0' value is written in the MRAM cell. Directions and levels of the write currents IP and IAP and times taken to write a logical '1' value and a logical '0' value may be variable according to logical values to be stored. In particular, a high current level and a long write time may be required to write a logical '1' value in an MRAM cell in which a logical '0' value is previously stored. Thus, as the number of MRAM cells being switched from a parallel state to an anti-parallel state increases, the integrity of data stored by said memory cells is reduced while the overall write time increases. Further, power consumption during the write operation rises.

Figure 3:
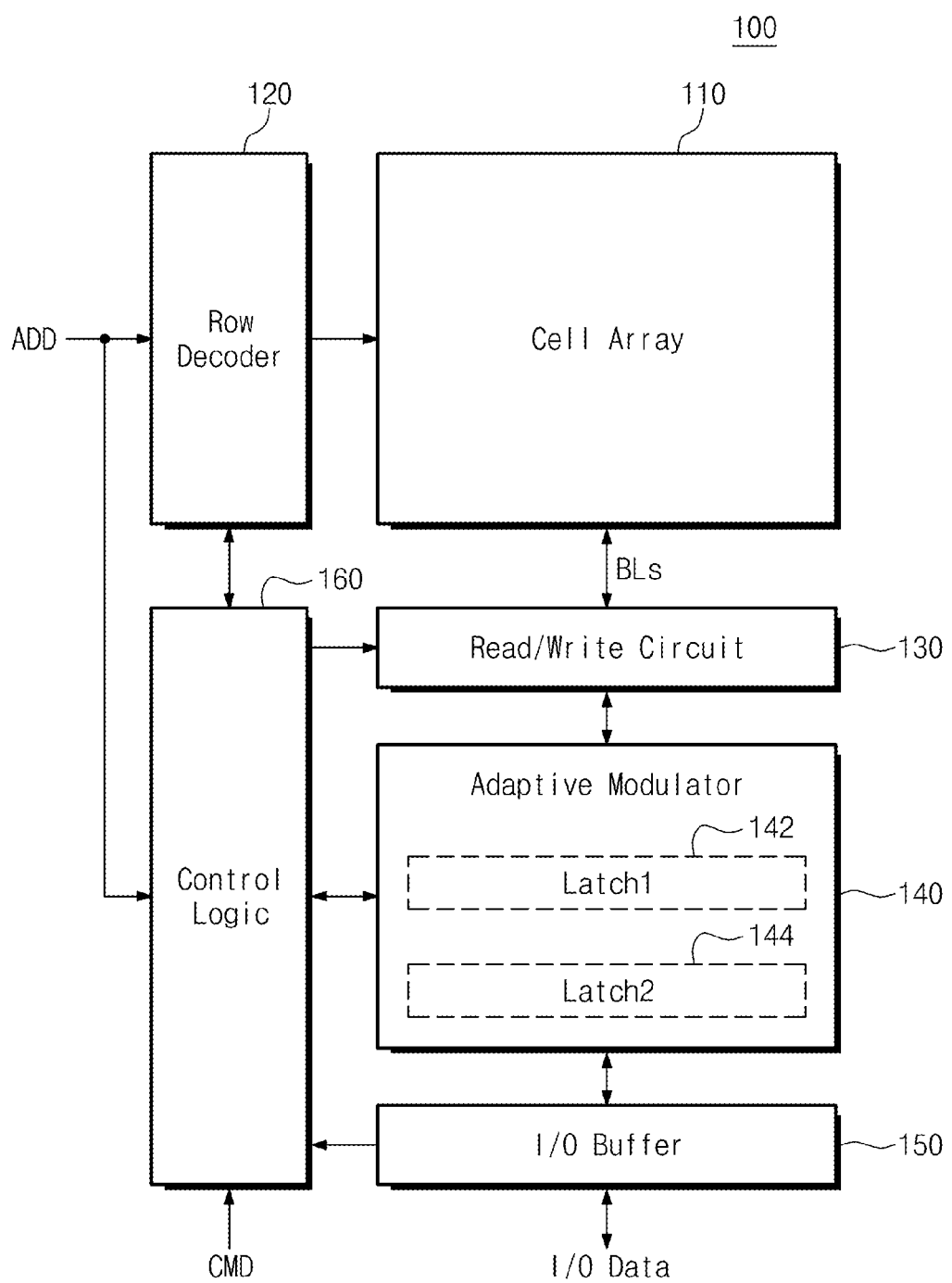
FIG. 3 is a block diagram illustrating a nonvolatile memory device according to an embodiment of the inventive concept.

FIG. 3 is a block diagram illustrating a nonvolatile memory device according to an embodiment of the inventive concept. Referring to FIG. 3, a nonvolatile memory device 100 comprises a cell array 110, a row decoder 120, a read/write circuit 130, an adaptive modulator 140, an input/output buffer 150, and control logic 160.

The cell array 110 includes a plurality of memory cells connected to word lines and bit lines. Each of the memory cells in the cell array 110 may be formed as the memory cell of FIG. 1. That is, the bias condition when a logical '1' value is stored in each memory cell is different from the bias condition when a logical '0' value is stored.

The row decoder 120 may be used to select one of the word lines in response to an address ADD. In this manner, the row decoder 120 may provide a gate voltage to a selection transistor of a selected memory cell.

The read/write circuit 130 may act as a write driver and a sense amplifier. During a read operation, the read/write circuit 130 may be used to sense data stored in selected memory cells. The read/write circuit 130 may provide a bit line bias for writing a logical '1' value or a logical '0' value in a selected memory cell.

The adaptive modulator 140 may be used to modulate externally provided write data according to a modulation scheme capable of minimizing data errors. Thus, in the illustrated example of FIG. 3, the adaptive modulator 140 provides "modulated write data" (MW_Data) to the read/write circuit 130, and comprises a first latch 142 and a second latch 144 that may be used to select a particular modulation scheme.

For example, the first latch 142 may be used to store "previous data" (R-Data) that is read from selected memory cells, while the second latch 144 may be used to store "write data" (W_Data) to be written in selected memory cells by a current write operation. The adaptive modulator 140 may then be used to modulate the write data (W_Data) stored in the second latch 144 according to one of a plurality of possible modulation schemes.

The adaptive modulator 140 may then compare the resulting modulated write data (MW_Data) with the previous data (R_Data) stored in the first latch 142 and count a number of "flip bits" (nFB), as well as a number of "switching bits" (nSB). Each fit bit (FB) is a bit having an inverse relation between the previous data (R_Data), the write data (W_Data), and the modulated data (MW_Data). A memory cell corresponding to a flip bit (FB) or a bit that is not a switching bit (SB) will be maintained in its previous data (R_Data) bit value without a write bias.

Each switching bit (SB) is a bit that corresponds to a memory cell having its magnetization direction switched from a parallel state P to an anti-parallel state if the modulated write data (MW_Data) were overwritten to the memory cell. With this information, the adaptive modulator 140 may select either the write data (W_Data) and the modulated data (MW_Data) based on the number of flip bits (nFB) and the number of switching bits (nSB).

For example, the adaptive modulator 140 may select one, having the least number of switching bits (nSB), from among the write data (W_Data) and the modulated data (MW_Data). Alternatively, the adaptive modulator 140 may select one of the write data (W_Data) and the modulated data (MW_Data) considering the number of flip bits (nFB) and the number of switching bits (nSB). Data thus selected may be transferred to the read/write circuit 130.

Additionally, the adaptive modulator 140 may be used to demodulate read data retrieved during a read operation. The read data may be demodulated according to a demodulation scheme corresponding to the modulation scheme used to define the read data as stored in the memory cell array 110.

The input/output (I/O) buffer 150 may be used to temporarily store externally provided data. The stored data may then be communicated to and stored by the adaptive modulator 140. During a read operation, the I/O buffer 150 may be used to temporarily store data demodulated by the adaptive modulator 140. The stored read data may then be provided to circuitry external to the nonvolatile memory device 100.

The control logic 160 may be used to control the operation and inter-operation of the row decoder 120, read/write circuit 130, and adaptive modulator 140 in response to a command CMD. When write data (W_Data) is received, the control logic 160 may control the read/write circuit 130 in response to a target address ADD, indicating where the write data (W_Data) is to be stored (i.e., the selected memory cells). The control logic 160 also be used to control the adaptive modulator 140 such that previous data (R_Data) read from the memory cell array 110 is stored in the first latch 142 of the adaptive modulator 140. The control logic 160 may also be used to control the adaptive modulator 140 such that "selected data" selected in accordance with the number of flip bits (nFB) and/or the number of switching bits (nSB) is communicated to the read/write circuit 130.

When write data (W_Data) is received from an external device, the nonvolatile memory device 100 may modulate the write data (W_Data) according to one or more of a plurality of modulation schemes. The adaptive modulator 140 may than be sued to count the number of flip bits (nFB) and the number of switching bits (nSB) by comparing the write data (W_Data) with the modulated write data (MW_Data) resulting from each of the modulation scheme with the previous data (R_Data) that currently stored by the selected memory cells and to which the write data (W_Data) is to be stored. The adaptive modulator 140 may select the particular set of the modulated write data (MW_Data) including the lowest number of switching bits (nSB) that will generally have the greatest influence on data errors. Alternatively, in the event that the number of flip bits (nFB) exceeds a predetermined threshold, the adaptive modulator 140 may select a particular modulation scheme based on the number of switching bits (nSB).

According to certain embodiments of the inventive concept, it is possible to reduce the number of memory cells programmed from a parallel state P to an anti-parallel state AP. Here, the memory cells programmed from a parallel state P to an anti-parallel state AP may degrade data integrity, increase write current, and/or increase write time.

Figure 4:
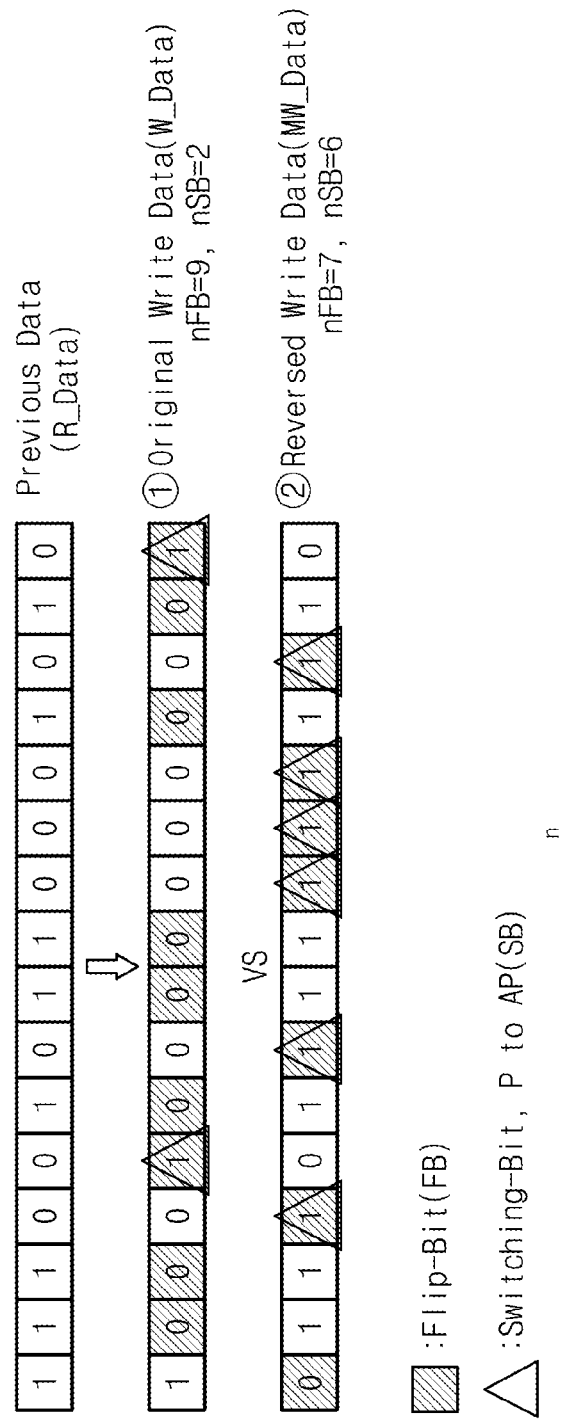
FIG. 4 is a conceptual diagram illustrating a modulation method that may be used by the nonvolatile memory device of FIG. 3 in an embodiment of the inventive concept.

FIG. 4 is a conceptual diagram further illustrating a modulation method that may be used by the nonvolatile memory device of FIG. 3 according to an embodiment of the inventive concept. Referring to FIG. 4, a bit reversion modulation scheme is used as an assumed example of many available modulation schemes that might be used. In this working example that assumes the use of only a single modulation scheme, either the write data (W_Data) or the modulated write data (MW_Data) derived by the bit reversion modulation scheme will be deemed the selected data, such that the number of flip bits (nFB) and the number of switching bits (nSB) are optimized.

When the write data (W_Data) and a target address ADD are received from an external source (e.g., a host, memory controller, or processor), control logic 160 may be used to control the read/write circuit 130 to read previous data (R_Data) that is currently stored in the selected memory cells identified by the target address ADD. When read, the previous data (R_Data) may then be stored in the first latch 142 of the adaptive modulator 140. The reading of the previous data (R_Data) may be performed (e.g., during a time period during which the write data (W_Data) is being modulated.

As illustrated in FIG. 4, it is assumed that the previous data (R_Data) stored in the selected memory cells is '1110 0101 1000 1010', that the write data (W_Data) is '1000 1000 0000 0001', and that the modulated write data (MW_Data) derived by the bit reversion modulation scheme is '0111 0111 1111 1110'. Hence, the write data (W_Data) and the modulated write data (MW_Data) may be stored in the second latch 144.

The adaptive modulator 140 may now count the number of flip bits (nFB) and the number of switching bits (nSB) generated when the un-modulated write data (W_Data) is used to overwrite the previous data (R_Data) stored in the first latch 142. In the working example of FIG. 4, nine (9) flip bits (nFB) are generated when the un-modulated write data (W_Data) is used to overwrite the previous data (R_Data). Two (2) of the flip bits (nFB) are also switching bits (nSB) that transition from a logical '0' value to a logical '1' value. On the other hand, seven (7) flip bits (nFB) are generated when the modulated write data (MW_Data) is used to overwrite the previous data (R_Data). However, six (6) bits of the flip bits (nFB) are switching bits (nSB) that transition from a logical '0' value to a logical '1' value.

The adaptive modulator 140 may be used to determine the "selected data" to be written to the selected memory cells between the write data (W_Data) or the modulated write data (MW_Data) in the illustrated example of FIG. 4. This determination is made based on the number of flip bits (nFB) and the number of switching bits (nSB). That is, the adaptive modulator 140 may determine the selected data in order to obtain the lowest possible error rate and/or the shortest write time using the information regarding flip bits (nFB) and switching bits (nSB).

In the particular example described in relation to FIG. 4, a lower error rate is obtained by selecting the write data (W_Data) as the selected data since it results in the fewest switching bits (nSB). However, the adaptive modulator 140 may alternately be used to determine the selected data considering the number of flip bits (nFB). For example, when there is a difference between the number of flip bits (nFB) resulting from the write data (W_Data) and the number of flip bits (nFB) resulting from the modulated write data (MW_Data), the adaptive modulator may be used to select the data having the fewest number of flip bits (nFB).

Figure 5:
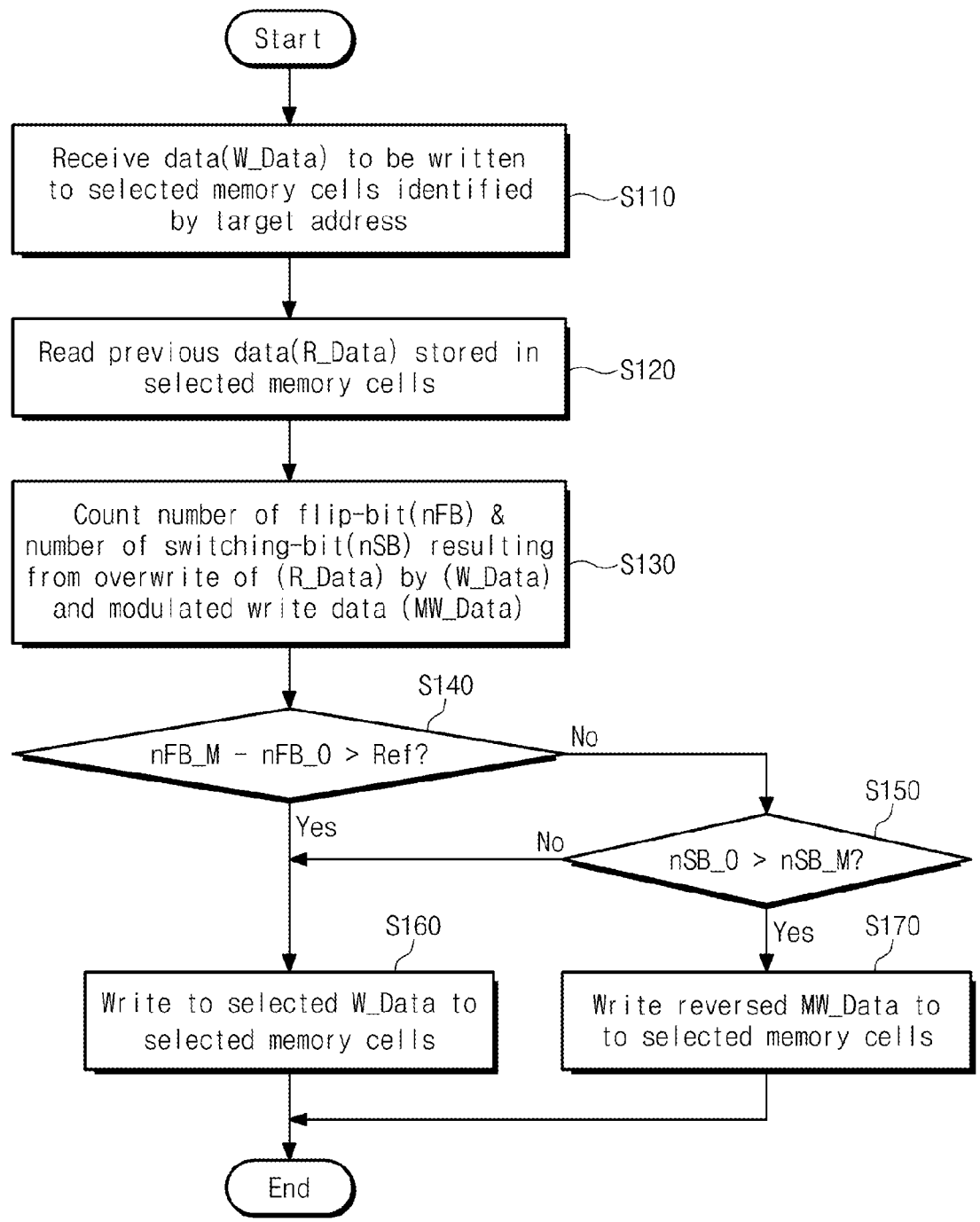
FIGS. 5 and 6 are respective flow charts summarizing write methods according to certain embodiments of the inventive concept.

FIG. 5 is a flow chart summarizing a write method according to an embodiment of the inventive concept. It is again assumed that a data write operation for a nonvolatile memory device like the one described above uses a bit reversion modulation scheme to derive modulated write data (MW_Data) from externally provided write data (W_Data).

Thus in the context of the memory device illustrated in FIG. 4, the nonvolatile memory device 100 receives write data (W_Data) to be written to selected memory cells identified by a target address ADD (S110).

Previous data (R_Data) currently stored in the selected memory cells is read (S120). That's is, under the control of control logic 160, the read/write circuit 130 may be used to sense the stored data values in the selected memory cells. The previous data (R_Data) read via the read/write circuit 130 is then stored in a first latch 142 of the adaptive modulator 140.

Next, a number of flip bits (nFB) and a number of switching bits (nSB) resulting from an overwriting of the previous data (R_Data) by the write data (W_Data) and the modulated write data (MW_Data) are counted (S130). That is, a first number of flip bits (nFB_O) resulting from an overwrite of the write data (W_Data) and a second number of flip bits (nFB_M) resulting from an overwrite of the modulated write data (MW_Data) are determined. Additionally, a first number of switching bits (nSB_O) resulting from the overwrite of the write data (W_Data) and a second number of switching bits (nSB_M) resulting from the overwrite of the modulated write data (MW_Data) are determined.

Then, the first number of flip bits (nFB_O) is subtracted from the second number of flip bits (nFB_M) to generate a difference value that is compared to a reference value (Ref) (S140).

If the different value is greater than the reference value (S140=Yes), then the write data (W_Data) is selected to be written to the selected memory cells (S160). Otherwise, if the different value is not greater than the reference value (S140=No), the first number of switching bits (nSB_O) is compared to the second number of switching bits (nSB_M) (S150).

If the first number of switching bits (nSB_O) is greater than the second number of switching bits (nSB_M) (S150=Yes), then the modulated write data (W_Data) (or a derivation of same) is selected to be written to the selected memory cells (S170). However, if the first number of switching bits (nSB_O) is not greater than the second number of switching bits (nSB_M) (S150=No), then again the write data (W_Data) is selected to be written to the selected memory cells (S160).

During the writing of the write data (W_Data) to the selected memory cells (S160) and/or the writing of the modulated write data (MW_Data) to the selected memory cells (S170), appropriate metadata may be added to indicate that respective use of un-modulated write data (W_Data) or a particular type of modulated write data (MW_Data). That is, this metadata may subsequently be referred to during a decoding operation performed by the adaptive modulator 140 in response to a read command directed to the selected memory cells.

From the foregoing, those skilled in the art will understand that certain embodiments of the inventive concept have been described that assume either one of write data (W_Data) or modulated data (MW_Data) is determined to be selected data to be written to selected memory cells. A simple bit reversion modulation scheme has been used that reverses write data (W-Data) bits. However, the inventive concept is not limited to only these teaching examples. Any number and/or type of modulation scheme(s) might be used to generate potential selected data to actually be written to the selected memory cells that results in a fewest number of flip bits and/or a fewest number of switching bits.

Figure 6:
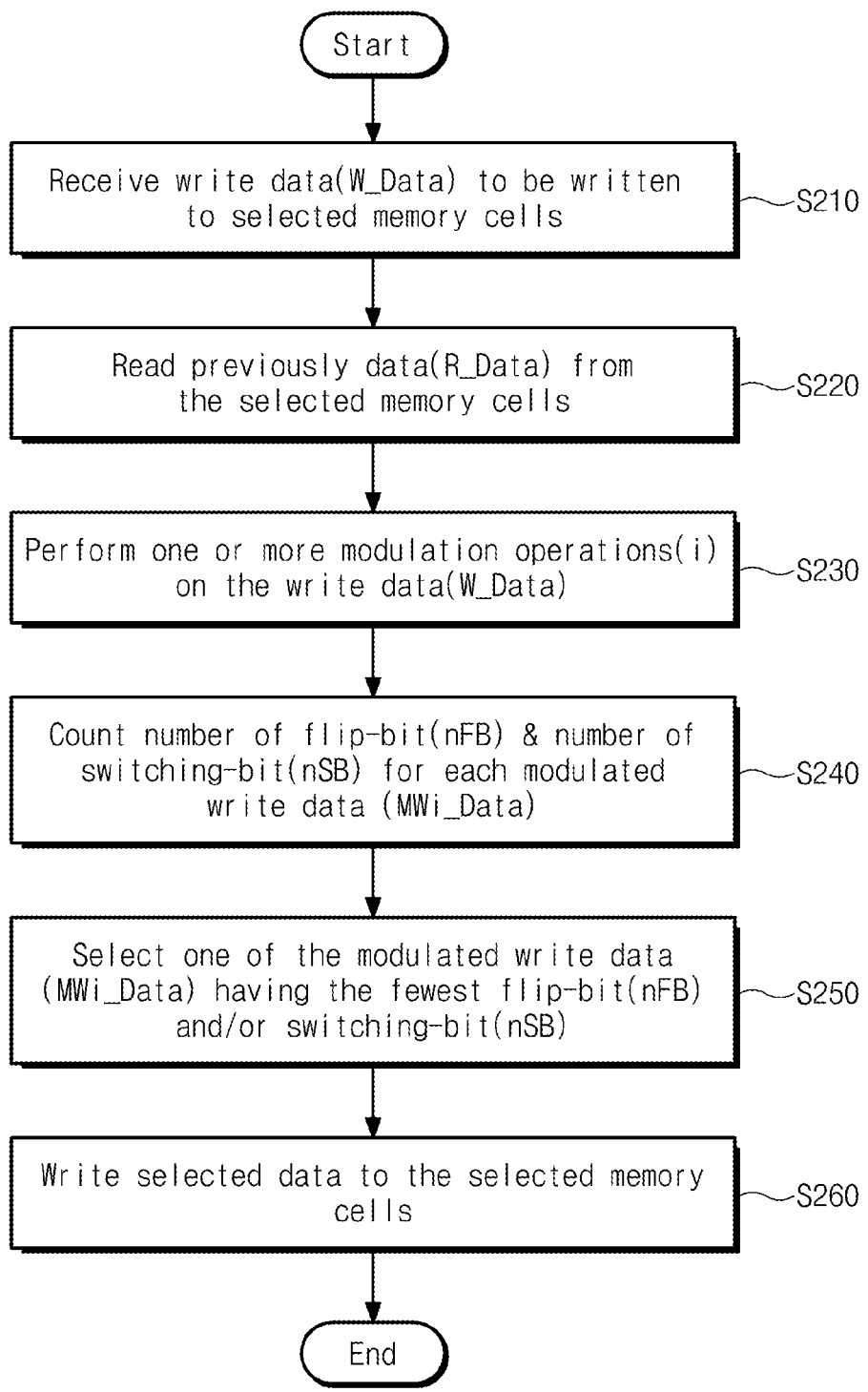

FIG. 6 is a flow chart summarizing a method of writing data in a nonvolatile memory device according to an embodiment of the inventive concept, wherein a number ("k") of different modulation schemes are used to generate multiple sets of modulated write data (MWi_Data), where i ranges from 1 to k. Thereafter, the one set of modulated write data (MW-Data) associated with the fewest number of flip bits (nFB) and/or the fewest number of switching bits nSB may be determined as the selected data to be written to the selected memory cells.

As shown in FIG. 6, write data (W_Data) to be written to selected memory cells is received from an external source (S210). The write data (W_Data) may be received with a target address corresponding to the selected memory cells.

Again, previous data (R_Data) is read from the selected memory cells (S220). That is, under the control of the control logic 160, the read/write circuit 130 may be used to sense the stored data of the selected memory cells. The previous data (R_Data) read via the read/write circuit 130 may then be stored in the first latch 142 of the adaptive modulator 140.

The write data (W_Data) stored in the second latch 144 may then be variously modulated using a number ("k") of different modulation schemes (S230). Each modulation scheme used will generate a corresponding set of modulated write data (MWi_Data), where "i" varies from 1 to k that may be stored in the second latch 144. Possible modulation schemes include circular modulation schemes, differential modulation schemes, etc.

Then, a number of flip bits FB and/or switching bits SB may be counted for each instance wherein a particular set of modulated write data (MWi_Data) is used to overwrite the previous data (R_Data) (S240).

Once a number of flip bits and/or switching bits is known for each set of modulated write data (MWi_Data), one of the modulated write data sets or the original write data (W_Data) may be determined to be the selected data to be written to the selected memory cells (S250), and the selected data may be written (S260)

As before, the adaptive modulator 140 may be used to determine a particular set of modulated write data (MWi_Data) or the write data (W_Data) that should be the selected data in view of the flip bits and/or the switching bits. For example, the selected data may corresponding to write data set that corresponds to a least number of switching bits from all possible write data sets having a number of flip bits than a given reference value. Alternatively, the adaptive modulator 140 may select a particular write data set as the selected data considering only the number of switching bits.

Finally, the selected data is written to the selected memory cells (S260). At this time, as before, metadata indicating a relevant modulation scheme may be added to the selected data.

Figure 7:
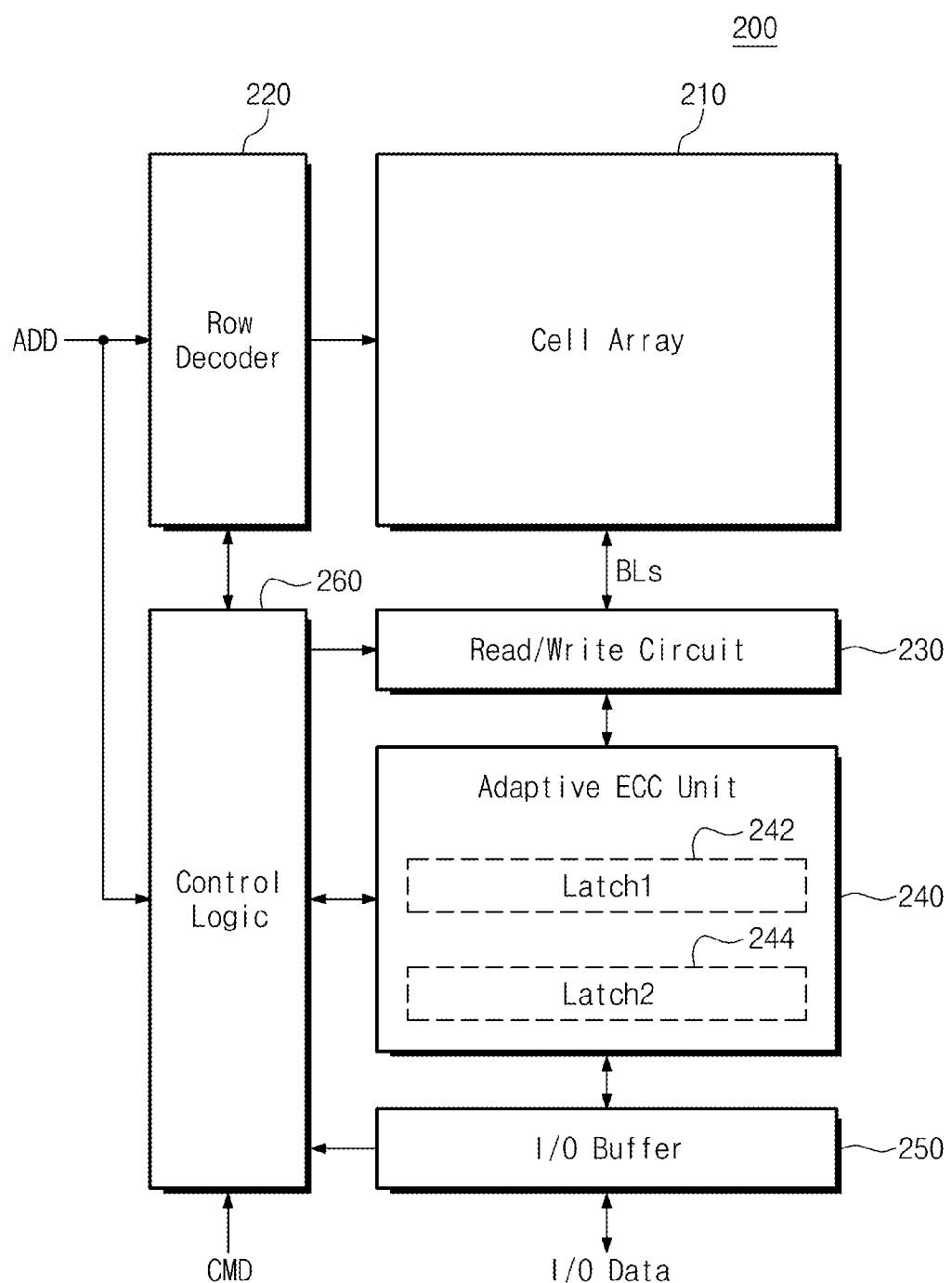
FIG. 7 is a block diagram illustrating a nonvolatile memory device according to another embodiment of the inventive concept.

FIG. 7 is a block diagram illustrating a nonvolatile memory device according to another embodiment of the inventive concept. The nonvolatile memory device 200 of FIG. 7 is the same as the nonvolatile memory device 10 of FIG. 3, except an adaptive ECC unit 240 is used instead of the adaptive modulator 140. Thus, with this exception, analogously numbered elements in FIG. 7 (2xx) are the same as elements in FIG. 1 (1xx) and will not be described again in detail The adaptive ECC unit 240 may be used to select an error detection/correction mode (ECC) based on the number of flip bits (nFB) and/or the number of switching bits (nSB) generated between the previous data (R_Data) and write data (W_Data), or generated between the previous data (R_Data) and one or more sets(s) of modulated write data (MW_Data). Thus, the adaptive ECC unit 240 may use a selected one of a plurality of different error correction modes to encode incoming write data.

For example, if the number of flip bits (nFB) and/or the number of switching bits (nSB) exceeds a reference value, the adaptive ECC unit 240 may encode the write data (W_Data) using an ECC mode having the least error correctability. Thus, the adaptive ECC unit 240 may include a first latch 242 and a second latch 244 to count flip bits and switching bits. However, the first latch 242 and the second latch 244 may be included in the control logic 260, or may be implemented by a separate latch block.

When write data (W_Data) is received, the control logic 260 may control the input/output buffer 250 such that the write data (W_Data) is stored in the second latch 244. The control logic 260 may be used to control the adaptive ECC unit 240 such that the encoded write data (EW_Data) is communicated to the read/write circuit 230. In one particular example, the encoded write data (EW_Data) may be data obtained by adding one or more parity bit(s) to the write data (W_Data).

Like the previously described embodiments, the embodiment of FIG. 7 uses a counted number of flip bits (nFB) existing between previous data (R_Data) and write data (W_Data) and/or a counted number of switching bits (nSB) existing between the previous data (R_Data) and the write data (W_Data). As the number of flip bits (nFB) and the number of switching bits (nSB) increase, the probability that a write error will be generated increases. In particular, switching bits may cause a delay in write time and a relatively high risk of write errors. Thus, there may be selected ECC modes having different error correctabilities based on the number of flip bits (nFB) and the number of switching bits (nSB). Write data may be encoded according an ECC mode having a low correctability when few flip bits and few switching bits exist. Thus, it is possible to reduce a time taken to perform an error correction encoding operation and a power consumed to perform an error correction encoding operation.

Figure 8:
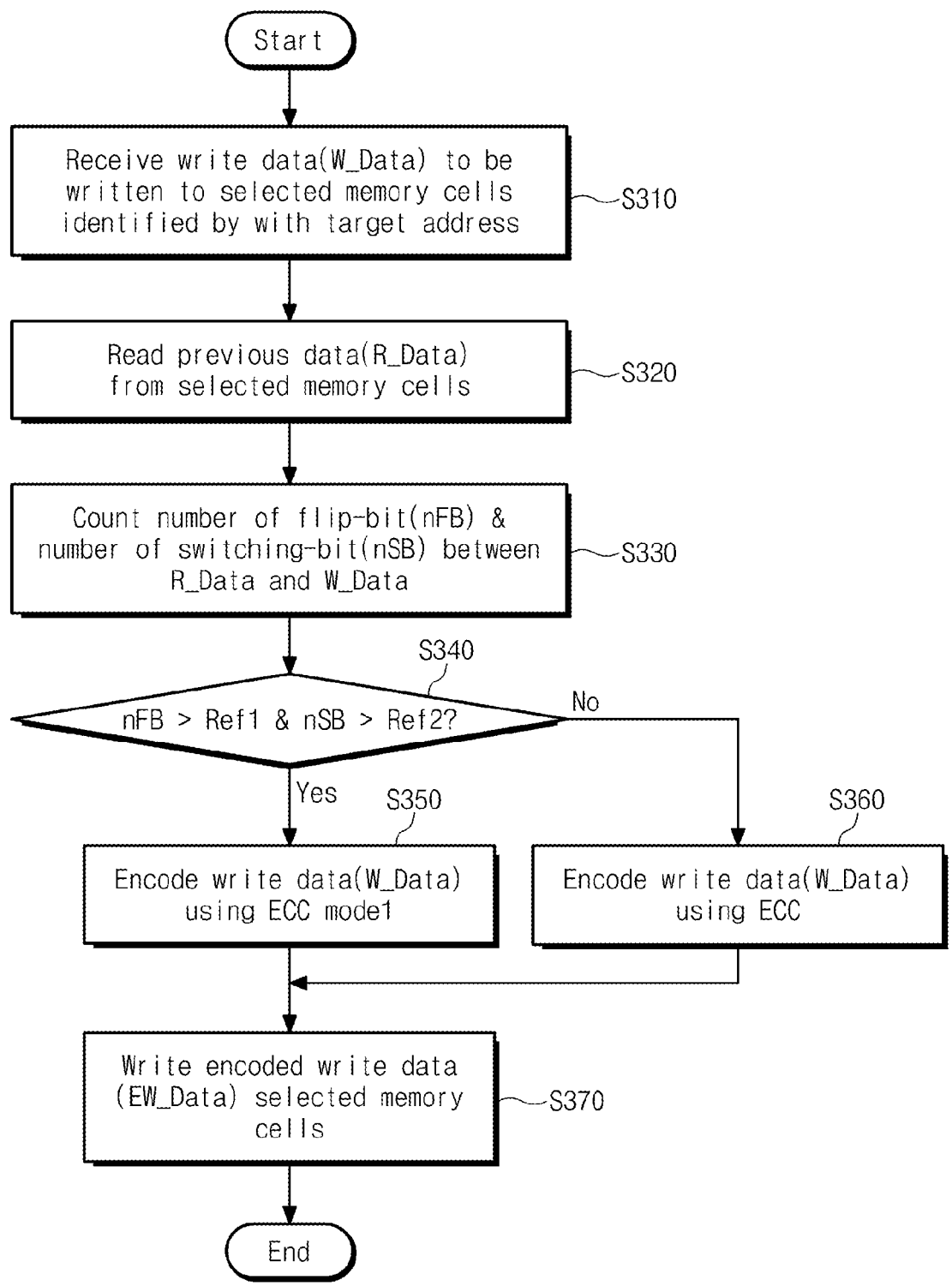
FIG. 8 is a flow chart summarizing a write method for the nonvolatile memory device of FIG. 7 according to an embodiment of the inventive concept.

FIG. 8 is a flow chart summarizing a write method for the nonvolatile memory device of FIG. 7 according to an embodiment of the inventive concept. Referring to FIG. 8, an ECC mode may be selected according to a number of flip bits (nFB) and/or a number of switching bits (nSB) obtained by comparing previous data (R_Data) with write data (W_Data).

Write data (W_Data) to be written to selected memory cells is received (S310). The write data (W_Data) may be received with a target address corresponding to the selected memory cells in which the write data (W_Data) is to be stored. The write data (W_Data) may be stored in a second latch 244.

Previous data (R_Data) stored in the selected memory area is read (S320). That is, the control logic 260 may be used to control the read/write circuit 230 to sense data stored in the selected memory cells. The previous data (R_Data) thus read may be stored in the first latch 242 of the adaptive ECC unit 240.

Flip bits and switching bits generated when the write data (W_Data) is used to overwrite the previous data (R_Data) are counted (S330). The adaptive ECC unit 240 may count the flip bits and the switching bits.

An ECC mode for the adaptive ECC unit 240 may be selected based on the number of flip bits nFB and the number of switching bits nSB in view of defined reference values (S340). For example, whether the number of flip bits nFB is less than a first reference value Ref1 and the number of switching bits nSB is more than a second reference value Ref2 may be determined. If so, the method proceeds to step S350. If not, the method proceeds to step S360.

The adaptive ECC unit 240 may encode the write data (W_Data) according to a first mode having a given error correctability (S350). For example, parity bits for the write data (W_Data) may be generated using the encoding operation. The adaptive ECC unit 240 may add parity bit(s) to the write data (W_Data) and may provide resultant encoded write data (EW_Data) to the read/write circuit 230.

The adaptive ECC unit 240 may encode the write data (W_Data) according to a second mode having an error correctability greater than the first mode (S360). Parity bits for the write data (W_Data) may be generated using the encoding operation. The adaptive ECC unit 240 may add parity bit(s) to the write data (W_Data) and provide resultant encoded write data (EW_Data) to the read/write circuit 230.

Finally, the read/write circuit 230 may be used to write the properly encoded write data to the selected memory cells (S370).

There is described an embodiment where an ECC mode is selected according to the number of flip bits (nFB) and the number of switching bits (nSB). It is understood that an ECC mode is selected variously according to the number of flip bits (nFB) and the number of switching bits (nSB). That is, three or more ECC modes may be used, and various references for deciding the number of flip bits nFB and the number of switching bits nSB may be utilized.

Figure 9:
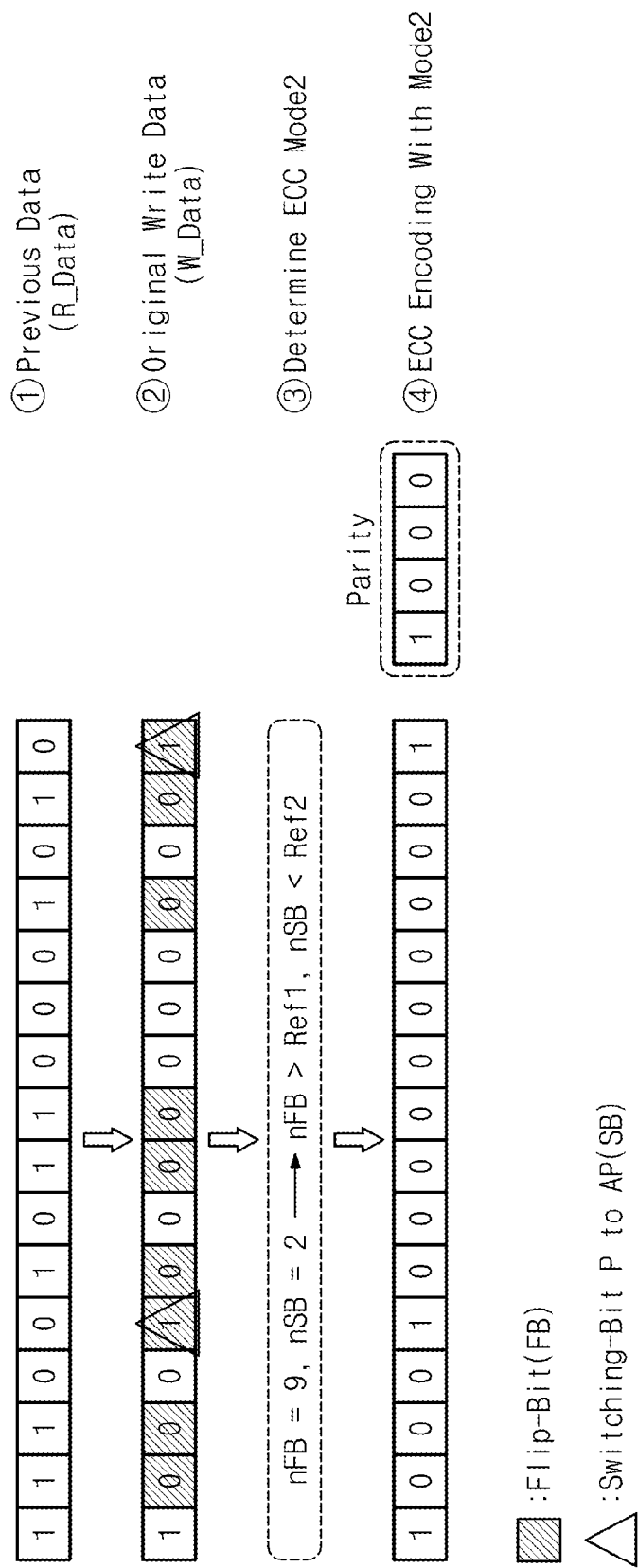
FIG. 9 is a conceptual diagram illustrating data flow during a data write operation performed in accordance with the write method of FIG. 8 according to an embodiment of the inventive concept.

FIG. 9 is a conceptual diagram illustrating a data flow during the data write method of FIG. 8 according to an embodiment of the inventive concept. Referring to FIG. 9, a particular embodiment is illustrated that assumes that an ECC mode is selected where a first reference value Ref1 is 5 and a second reference value Ref2 is 4.

It is further assumed that write data (W_Data) is '1000 1000 0000 0001' and previous data (R_Data) is '1110 0101 1000 1010' (①, ②). In this case, nine (9) flip bits and two (2) switching bits are generated when the write data (W_Data) is used to overwrite the previous data (R_Data). Thus, the number of flip bits (nFB) is greater than the first reference value Ref1, while the number of switching bits (nSB) is less than the second reference value Ref2. As a result, ECC encoding is performed using the second mode having large error correctability.

When the ECC encoding is performed according to the second mode, parity bits '1000' used for error detection/correction are generated. The parity bits are added to the write data (W_Data), and resulting encoded write data may be written to the selected memory cells via the read/write circuit 230.

Figure 10:
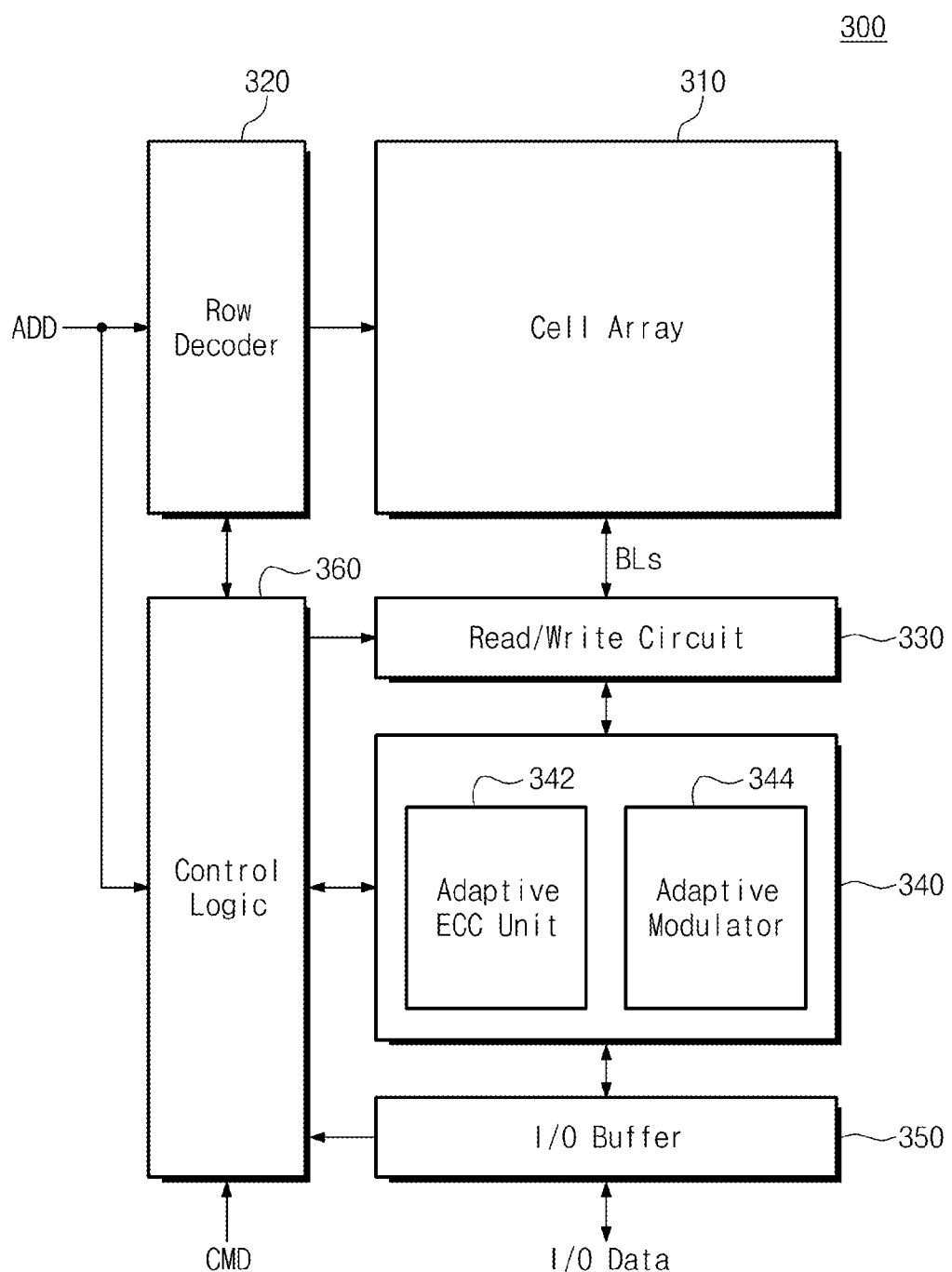
FIG. 10 is a block diagram illustrating a nonvolatile memory device according to still another embodiment of the inventive concept.

FIG. 10 is a block diagram illustrating a nonvolatile memory device according to still another embodiment of the inventive concept. Referring to FIG. 10, a nonvolatile memory device 300 comprises analogous elements (3xx) as has been previously described.

However, the nonvolatile memory device 300 includes an encoding block 340 capable of performing error correction (per element 240 of FIG. 7) and data modulation (per element 140 of FIG. 3). When write data (W_Data) is received, the encoding block 340 may select an optimal modulation scheme from an available plurality of modulation schemes based on the number of flip bits (nFB) and the number of switching bits (nSB). The encoding block 340 may also modulate the write data (W_Data) according to a selected modulation scheme. That is, modulation of the write data (W_Data) may be performed by an adaptive modulator 344.

Hence, the encoding block 340 includes an adaptive ECC unit 342 which selects one of a plurality of ECC modes based on the number of flip bits (nFB) generated when the modulated write data is written in a selected memory area and the number of switching bits (nSB) generated when the modulated write data is written in the selected memory area. The number of flip bits (nFB) and the number of switching bits (nSB) that the adaptive ECC unit 342 refers may be values that are in predetermined by the adaptive modulator 344.

Although a latch for storing previous data (R_Data) and a latch for storing write data (W_Data) and modulated data (MW_Data) are not illustrated in FIG. 10, such latches may be provided either internal to or external from the encoding block 340.

Figure 11:
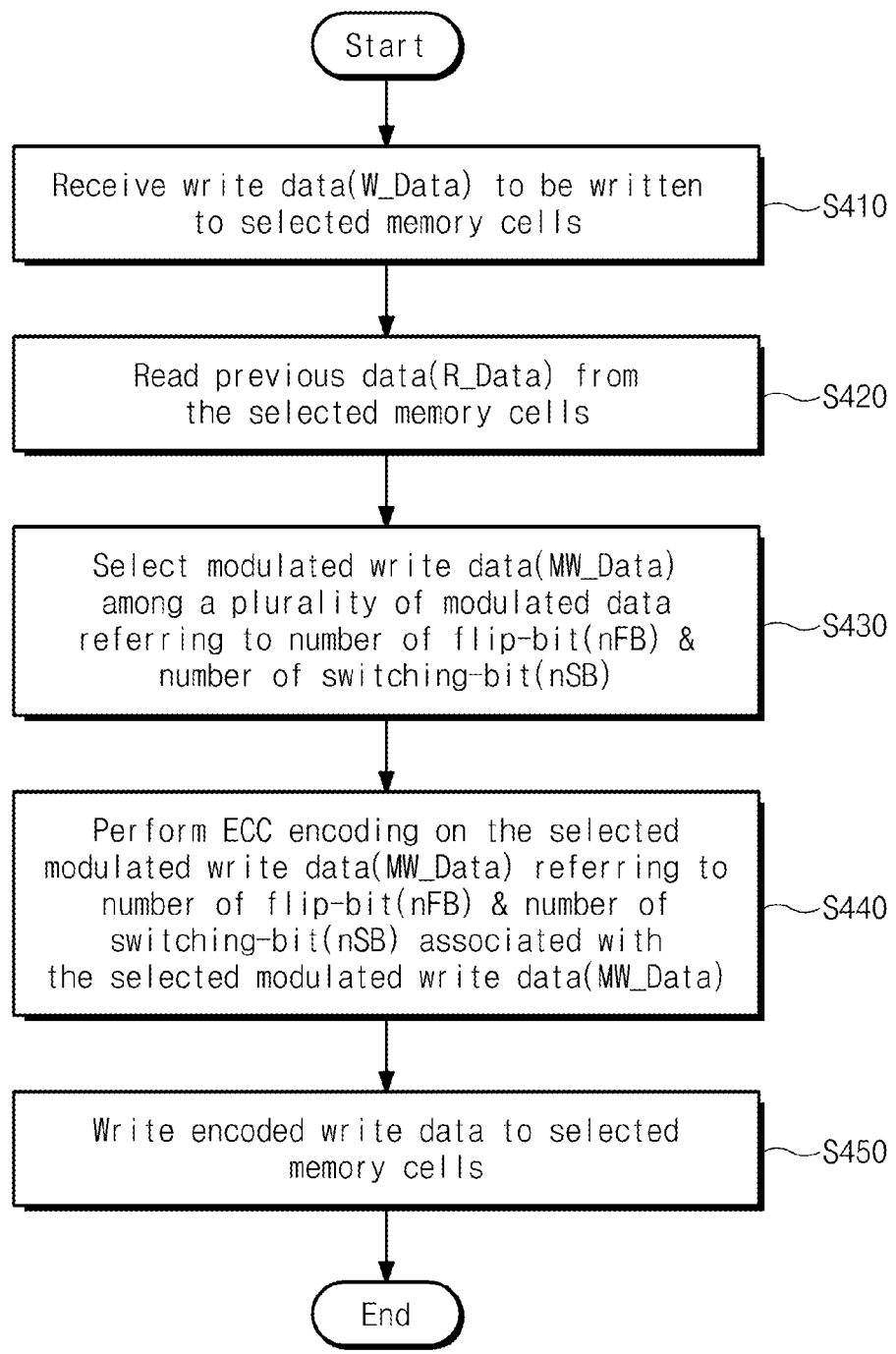
FIG. 11 is a flow chart summarizing a data write method for the nonvolatile memory device of FIG. 10 according to an embodiment of the inventive concept.

FIG. 11 is a flow chart summarizing a data write method that may be used in conjunction with the nonvolatile memory device of FIG. 10 according to an embodiment of the inventive concept. Referring to FIG. 11, there is described an embodiment where a modulation manner and an ECC mode about write data (W_Data) are selected.

The nonvolatile memory device 300 receives the write data (W_Data) to be written to the selected memory cells (S410). The write data (W_Data) may be received with a target address corresponding to a memory area in which the write data (W_Data) is to be stored.

Previous data (R_Data) stored in the selected memory cells is read (S420). That is, under the control of the control logic 360, the read/write circuit 330 may be used to sense the selected memory cells. The previous data (R_Data) read via the read/write circuit 330 is stored in a first latch (not shown).

The write data (W_Data) stored in a second latch (not shown) may be modulated using the adaptive modulator 342 based on a plurality of modulation operations (S430). The write data (W_Data) stored in the second latch may be modulated according to various modulation schemes. Then, flip bits and switching bits may be counted based on the write data (W_Data) and various sets of modulated data (MWi_Data) derived by the different modulation schemes. Selected data may be determined based on the number of flip bits (nFB) and the number of switching bits (nSB).

An ECC mode may then be selected according to the number of flip bits (nFB) and the number of switching bits (nSB) (S440). Values calculated in step S430 may be used as the number of flip bit (nFB) and the number of switching bits (nSB). The adaptive ECC unit 344 may be used to encode the write data (W_Data) according to the selected ECC mode.

The, the read/write circuit 330 may be used to write the encoded write data using the encoding block 340 to the selected memory cells (S450). At this time, data written in the selected memory area may include parity data generated by the encoding scheme used.

Figure 12A:
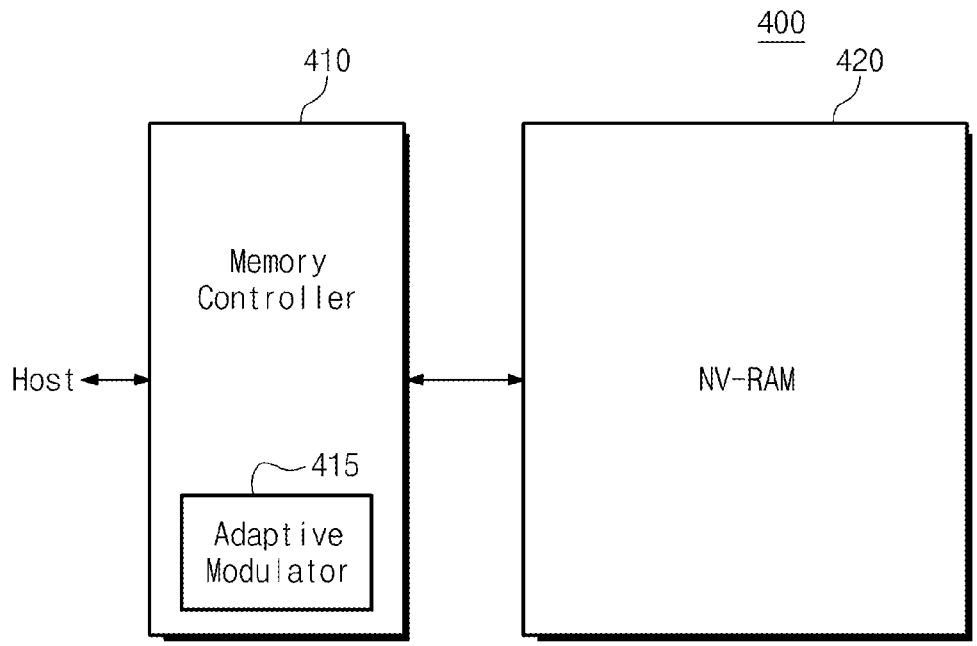
FIGS. 12A, 12B and 12C are respective block diagrams illustrating memory systems according to certain embodiments of the inventive concept.
Figure 12B:
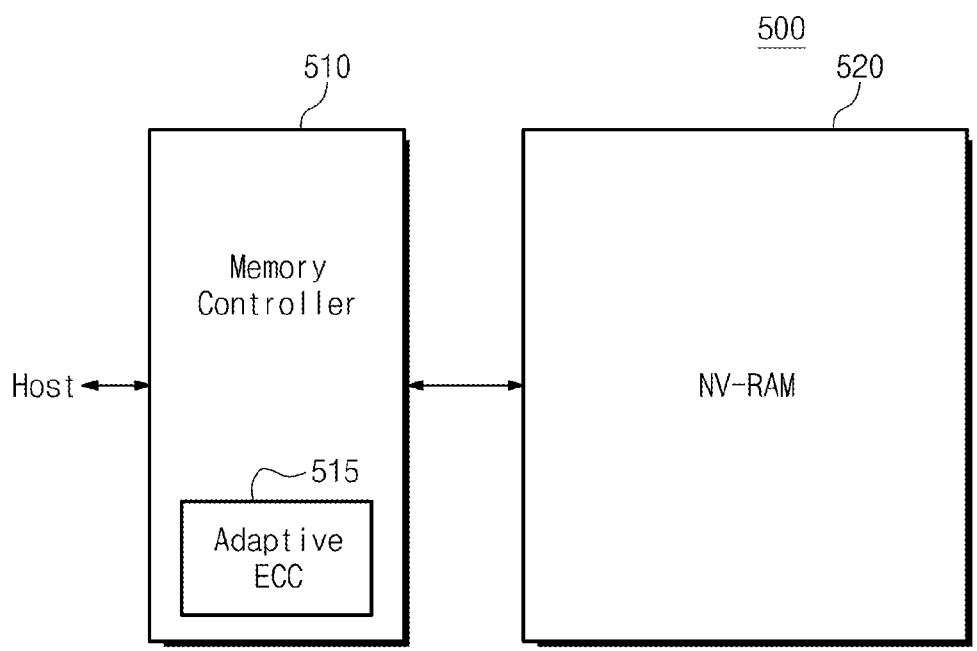
Figure 12C:
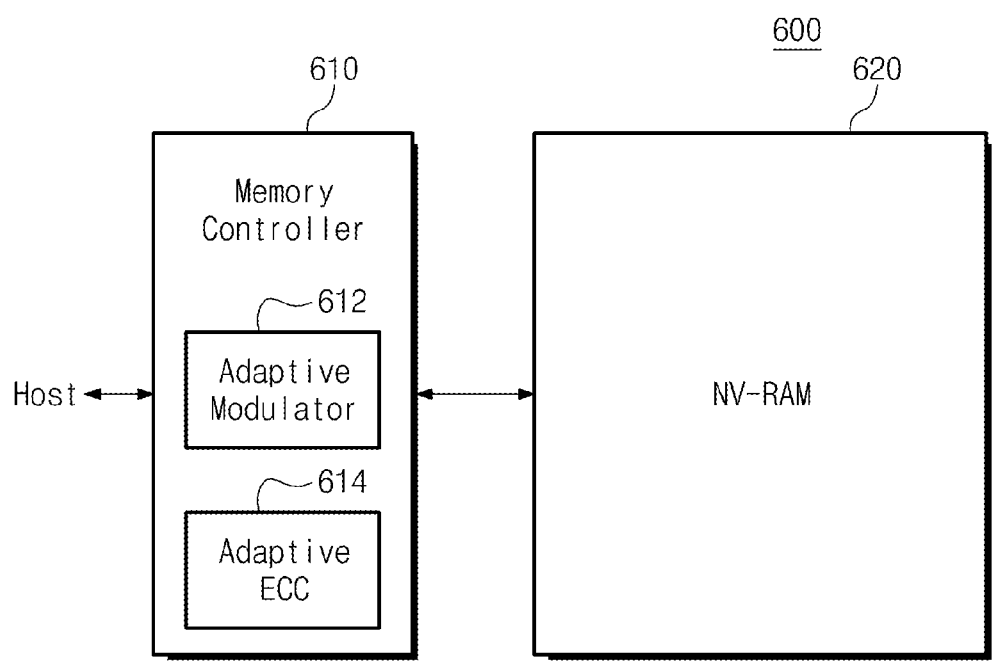

FIGS. 12A, 12B and 12C are respective block diagrams illustrating memory systems according to various embodiments of the inventive concept.

Referring to FIG. 12A, a memory system 400 may comprise a memory controller 410 including an adaptive modulator 415 and a nonvolatile RAM 420. The memory controller 410 may select one of data values generated by modulating write data provided from a host according to a plurality of modulation manners.

The adaptive modulator 415 may modulate the write data through a plurality of modulation operations. For example, the adaptive modulator 415 may modulate the write data according to various modulation operations such as a circular modulation operation, a differential modulation operation, a bit reversion modulation operation, etc. Flip bits and switching bits of modulated data values as results of the modulation operations may be counted. The adaptive modulator 415 may select one of the write data and the modulated data values based on the number of flip bits (nFB) and the number of switching bits (nSB).

Referring to FIG. 12B, a memory system 500 may comprise a memory controller 510 and a nonvolatile RAM 520. The memory controller 510 may include an adaptive ECC unit 515 which performs ECC modes with different error correctabilities.

The adaptive ECC unit 515 may select an ECC mode according to the number of flip bits (nFB) and the number of switching bits (nSB) about write data provided from a host. When that larger error correctability is required is determined according to the number of flip bits (nFB) and the number of switching bits (nSB), the adaptive ECC unit 515 may encode the write data according to a first mode. When that smaller error correctability is required is determined according to the number of flip bits (nFB) and the number of switching bits (nSB), the adaptive ECC unit 515 may encode the write data according to a second mode. Here, the ECC mode may be divided into three or more ECC modes.

Referring to FIG. 12, a memory system 600 may include a memory controller 610 and a nonvolatile RAM 620. The memory controller 610 may include an adaptive modulator 612 and an adaptive ECC unit 614. The adaptive modulator 612 may select one of modulated data values generated according to a plurality of modulation manners, based on the number of flip bits (nFB) and the number of switching bits (nSB) generated at overwriting.

The adaptive ECC unit 614 may select an ECC mode according to the number of flip bits (nFB) and the number of switching bits (nSB) about the modulated data. When that larger error correctability is required is determined according to the number of flip bits (nFB) and the number of switching bits (nSB), the adaptive ECC unit 614 may encode the write data according to a first mode. When that smaller error correctability is required is determined according to the number of flip bits (nFB) and the number of switching bits (nSB), the adaptive ECC unit 614 may encode the write data according to a second mode.

Figure 13:
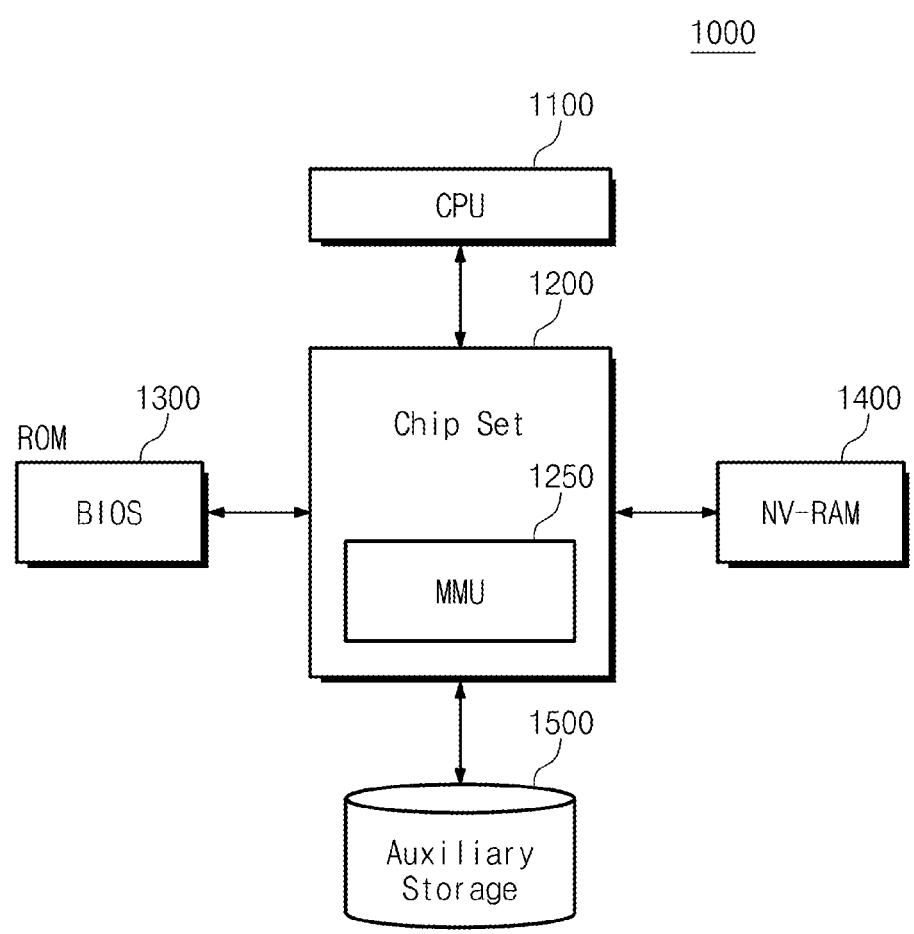
FIG. 13 is a general block diagram illustrating a user device that may incorporate one or more memory device(s) according to an embodiment of the inventive concept.

FIG. 13 is a block diagram schematically illustrating a user device according to an embodiment of the inventive concept. Referring to FIG. 13, a user device 1000 according to an embodiment of the inventive concept may be a computer system, for example. The user device 1000 may include a CPU 1100, a chipset 1200, a ROM 1300, a nonvolatile RAM 1400, and an auxiliary storage device 1500. Herein, the nonvolatile RAM 1400 may be used as a main memory or working memory of the user device 1000.

The CPU 1100 may read and execute the Basic Input/Output System (BIOS) or the Operating System (OS) from the ROM 1300 or the auxiliary storage device 1500. At a booting operation, the CPU 1100 may read and execute a boot program (or, a bootstrap) of the BIOS from the ROM 1300. The CPU 1100 may perform a data processing operation of the user device 1000. The CPU 1100 may access the auxiliary storage device 1500 according to a predetermined sequence to drive a program such as the OS at booting. The CPU 1100 may control the auxiliary storage device 1500 and a memory management unit (MMU) 1250 to read OS data stored in the auxiliary storage device 1500 and to store the read OS data in the nonvolatile RAM 1400. The above-described operations of the CPU 1100 may be exemplary. The CPU 1100 may control an overall operation of the user device 100.

The chipset 1200 may control devices mounted at the user device 1000. The chipset 1200 may include a plurality of control circuits to control devices mounted at the user device 1000. In particular, the chipset 120 may include the memory management unit (MMU) 1250 to control the nonvolatile RAM 1400.

The chipset 1200 may be divided into two chipsets: a North Bridge and a South Bridge. The North Bridge may be located at a place close to the CPU 1100 to control the CPU 1100 and the nonvolatile RAM 1400. In this case, the memory management unit 1250 may be included within the North Bridge. Also, although not shown in figures, expansion card slots for high-speed devices such as AGP, PCI express, and so on can be removed from the North Bridge.

Compared with the North Bridge, the South Bridge may be located relatively far from the CPU 1100. While the North Bridge controls devices associated with computation, the South Bridge may be mainly used to control input/output devices. The South Bridge may control an IDE/SATA port connected to HDD or ODD, an USB port connected to a keyboard or a mouse, a PCI slot such as a LAN card or a sound card. However, the function and structure of the chipset 1200 may not be limited to this disclosure. In some cases, the memory management unit 1250 may be built in the CPU 110.

The ROM 1300 may store the BIOS. The BIOS may support a basic process routine of the user device 1000. For example, the BIOS may include a start-up routine, a service process routine, and a hardware interrupt process routine. The start-up routine may perform POST and initialization works at booting of the user device 1000. The service process routine may process works requested by the OS or an application program.

The nonvolatile RAM 1400 may be used as a main memory or a working memory and driven on the user device 1000. The nonvolatile RAM 1400 may support a byte access like DRAM, and may be an over-writable nonvolatile memory device. The nonvolatile RAM 1400 used as the working memory may store the OS at driving of the user device 1000, a running application program, data to be updated, and so on. Here, the nonvolatile RAM 1400 may perform modulation and ECC encoding about write data considering an asymmetric characteristic generated according to logical values to be written. Thus, the nonvolatile RAM 1400 may provide high write speed and data reliability.

The auxiliary storage device 1500 may store user data or data such as the OS, an application program, and so on. The auxiliary storage device 1500 may be one of a hard disk drive (HDD), a solid state drive (SSD), and a hybrid HDD. The auxiliary storage device 1500 may be a large-capacity storage device, and may store programs driven on the user device 1000, codes, or setting data. However, the auxiliary storage device 1500 may not be limited to this disclosure.

The user device 1000 may further include a user interface, a battery, a modem, and so on. Although not shown in figures, the user device 1000 may further include an application chipset, a camera image processor (CIS), a mobile DRAM, and so on.

A nonvolatile RAM according to an embodiment of the inventive concept may be packed using various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the scope of the following claims. Therefore, it should be understood that the above embodiments are not limiting, but illustrative.

What is claimed is:

1. A data write method for a nonvolatile memory device, the method comprising:
    receiving externally provided write data to be stored in selected memory cells during a write operation;
    reading previous data previously stored in the selected memory cells;
    modulating the write data to generate modulated write data;
    counting a first number of flip bits and a first number of switching bits that result when the previous data is overwritten by the write data, and counting a second number of flip bits and a second number of switching bits that result when the previous data is overwritten by the modulated write data;
    selecting one of the write data and the modulated write data to be selected data based on the first number of flip bits, the first number of switching bits, the second number of flip bits, and the second number of switching bits; and
    writing the selected data to the selected memory cells.

2. The data write method of claim 1, wherein each of the selected memory cells comprises a magnetic tunnel junction element.

3. The data write method of claim 1, wherein selecting the one of the write data and the modulated write data to be selected data comprises:
    subtracting the first number of flip bits from the second number of flip bits to generate a difference value; and
    comparing the difference value to a reference value.

4. The data write method of claim 3, further comprising:
    if the difference value is greater than the reference value, selecting the write data as the selected data, else comparing the first number of switching bits to the second number of switching bits.

5. The data write method of claim 4, further comprising:
    if the first number of switching bits is greater than the second number of switching bits, selecting the modulated write data as the selected data, else selecting the write data as the selected data.

6. The data write method of claim 1, wherein modulating the write data to generate modulated write data comprises using one of a bit reversion modulation scheme, a circular shifting modulation scheme, and a differential modulation scheme to generate the modulated write data from the write data.

7. The data write method of claim 1, wherein the reading of the previous data stored in the selected memory cells and the modulating of the write data to generate modulated write data are performed at least in part at the same time.

8. A data write method for a nonvolatile memory device, the method comprising:
    receiving externally provided write data to be stored in selected memory cells during a write operation;
    reading previous data previously stored in the selected memory cells;
    modulating the write data using different modulation schemes to generate corresponding sets of modulated write data;
    counting respective numbers of flip bits and respective numbers of switching bits that result when the previous data is overwritten by the write data, and by each one of the sets of modulated write data;
    selecting the write data or one of the sets of modulated write data as selected data based on the respective numbers of flip bits and the respective numbers of switching bits; and
    writing the selected data to the selected memory cells.

9. The data write method of claim 8, wherein each of the selected memory cells comprises a magnetic tunnel junction element.

10. The data write method of claim 9, wherein each switching bit is a bit that corresponds to one of the selected memory cells having a magnetization direction for its magnetic tunnel junction element switched from a parallel state to an antiparallel state when a bit of one of the sets of modulated write data is used to overwrite the memory cell.

* * * * *